(12) United States Patent
Vukovic et al.

(10) Patent No.: US 6,393,853 B1
(45) Date of Patent: May 28, 2002

(54) LIQUID COOLING OF REMOVABLE ELECTRONIC MODULES BASED ON LOW PRESSURE APPLYING BIASING MECHANISMS

(75) Inventors: Aleksandar Vukovic; Tim A. Venus, both of Nepean; Howard J. Rajala, Kanata; Douglas B. Cross; Paul van Leeuwen, both of Ottawa; Kim Roberts, Nepean, all of (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/739,000

(22) Filed: Dec. 19, 2000

(51) Int. Cl.[7] .......................... F25D 23/12; F28F 7/100; H05K 7/20
(52) U.S. Cl. ................ 62/259.2; 165/80.4; 361/715
(58) Field of Search .............................. 62/259.2, 298, 62/383; 165/80.4; 361/702, 715

(56) References Cited

U.S. PATENT DOCUMENTS

| | | | | |
|---|---|---|---|---|
| 3,334,684 A | * | 8/1967 | Roush et al. | 62/259.2 |
| 4,155,402 A | * | 5/1979 | Just | 165/46 |
| 4,884,167 A | * | 11/1989 | Mine | 361/382 |
| 5,289,694 A | * | 3/1994 | Nordin | 62/259.2 |
| 5,581,441 A | * | 12/1996 | Porter | 361/701 |
| 6,055,157 A | * | 4/2000 | Bartilson | 361/699 |

* cited by examiner

Primary Examiner—William C. Doerrler (57) ABSTRACT

An apparatus for providing liquid cooling to high power high capacity, switching, transport and processing equipment is disclosed. The electronics of such equipment is typically contained in metal electronics modules, with the heat being directed to the walls of the modules. A pair of cooling plates with integral coolant flow through is pressed against the metal module walls with pressure. The cooling plates remain part of the shelf and the metal electronics modules can be removed for repair, exchange or upgrade.

14 Claims, 10 Drawing Sheets

LIQUID COOLING OF REMOVABLE ELECTRONIC MODULES BASED ON LOW PRESSURE APPLYING BIASING MECHANISMS

FIELD OF THE INVENTION

The invention relates generally to the thermal management for electronics equipment shelf/frame packaging and specifically to an apparatus for liquid cooling of electronic modules.

BACKGROUND OF THE INVENTION

Internet traffic is growing at a rate of approximately 400% per year and it appears that this trend will continue for at least a couple of years. To keep pace with traffic requirements, high speed, high capacity, dense electrical and optical packaging is required.

It is known that high density electronic equipment require intensive cooling during operation. The functional density of a given electronic unit is limited by its ability to dissipate heat from the unit. This is because the connectivity between different modules advocates an increase in density while heat requirements advocates less density. Prior telecom thermal management methods rely on various forms of air circulation through the shelf (natural, forced or forced-enhanced convection). Currently, enhanced air cooling continues to be the most cost-effective method to cool low to medium thermal density electronics. However, cooling technique is reaching its performance limits. This is because of the properties of air, such as its relatively low heat capacity and low conductivity.

Liquid cooling due to a liquid's relatively high heat capacity, has become common in the computer and broadcast industries. The electronic equipment used in these industries, by their inherent design, produce concentrated loads of heat. For example, in computer electronics, a core processor may be surrounded by lower power density hardware whereby the processor produces concentrated heat load. In contrast, the equipment used in the communications industry including the telecommunications and data communications, produce aggregate heat loads whereby cooling must be applied ubiquitously through a large electronics unit.

As the demands on the communications industry grows, so to does the equipment used to meet these demands. And larger electronic units produce greater amounts of heat, requiring more cooling power.

The communications industry further has demands on the serviceability of the equipment. Module extraction due to replacement, repair or regular maintenance is very important in the communications industry. It is highly unacceptable to shut down a unit in order to remove a component for any reason such as repair or replacement. In contrast, the computer industry commonly shuts down servers or other such equipment in order to service components. Due to this fact in the computer industry, cold plates are generally screwed or bolted to the component requiring cooling.

For these and other reasons, until now, it has not been feasible to use liquid cooling means in communications equipment. Therefore there is a need for an apparatus that combines the high heat transfer capabilities of liquid cooling with the ease of module extraction from electronic equipment. There is a further need in the communications industry for providing an electronic equipment shelf that at least partially alleviates the problems associated with current air cooling techniques.

SUMMARY OF THE INVENTION

An apparatus for the liquid cooling of removable electronic modules is disclosed.

According to an embodiment of the invention, there is provided an apparatus for cooling of an electronic module in a shelf unit comprising: at least first and second cold plates, each cold plate comprising an inlet and an outlet for coolant flow, said first and second cold plates adapted to receive the module therebetween; and a mechanism for moving the first and second cold plates towards and away from the module into operating and released positions respectively relative to the module when positioned therebetween such that: (a) when the cold plates have moved toward the module into the operating position, a surface of each said cold plate comes into heat transferring relationship with an associated surface of the module so that, in use, as a coolant flows through each cold plate, heat is transferred from the module to the coolant in each cold plate, and (b) when the first and second cold plates have been moved away from the module into the released position, the module is spaced from the cold plates to enable the module to be readily removed from between the cold plates.

According to an embodiment of the invention, there is provided an electronic shelf unit for mounting a plurality of electronic modules, the shelf unit having mounting means for removably electrically connecting an electronic module, and comprising an associated cooling apparatus for cooling of the electronic module, the cooling apparatus comprising; at least first and second cold plates, each cold plate comprising an inlet and an outlet for coolant flow, said first and second cold plates adapted to receive the module therebetween; and a mechanism for moving the first and second cold plates towards and away from the module into operating and released positions respectively relative to the module when positioned therebetween such that: (a) when the cold plates have moved toward the module into the operating position, a surface of each said cold plate comes into heat transferring relationship with an associated surface of the module so that, in use, as a coolant flows through each cold plate, heat is transferred from the module to the coolant in each cold plate, and (b) when the first and second cold plates have been moved away from the module into the released position, the module is spaced from the cold plates to enable the module to be readily removed from between the cold plates.

According to an embodiment of the invention, there is provided an electronic shelf unit used in the communications industry adapted to be populated with electronic modules, the modules being removably supported by the shelf unit, the shelf unit comprising an apparatus for liquid cooling of an electronic module in a shelf unit comprising: at least first and second cold plates, each cold plate comprising an inlet and an outlet for liquid flow, said first and second cold plates adapted to be positioned on opposing sides of the module, a surface of each said cold plate being in close heat transferring relation to an associated surface of the module; and a biasing mechanism to provide pressure capable of forcing the first and second cold plates towards the module to provide said close heat transferring relation between the plates and the module whereby as a cooling liquid flows from the inlet of each cold plate to the outlet of each cold plate, heat is transferred from the module to the liquid in each cold plate when in use, the mechanism comprising: a tool clamp mounted to one cold plate; and a slide plate positioned along the first and second cold plates and the module, the slide plate being pinned to the first and second cold plates through angled slots, the tool clamp being pivotally attached to the slide plate such that actuation of the tool clamp causes the slide plate to move towards the tool clamp thereby applying pressure forcing the first and second cold plates towards the module.

According to an embodiment of the invention, there is provided an electronic shelf unit used in the communications industry adapted to be populated with electronic modules, the modules being removably supported by the shelf unit, the shelf unit comprising an apparatus for liquid cooling of an electronic module in a shelf unit comprising: at least first and second cold plates, each cold plate comprising an inlet and an outlet for liquid flow, said first and second cold plates adapted to be positioned on opposing sides of the module, a surface of each said cold plate being in close heat transferring relation to an associated surface of the module; and a biasing mechanism to provide pressure capable of forcing the first and second cold plates towards the module to provide said close heat transferring relation between the plates and the module whereby as a cooling liquid flows from the inlet of each cold plate to the outlet of each cold plate, heat is transferred from the module to the liquid in each cold plate when in use; the mechanism comprising: a travel stop mounting the first and second cold plates together; and a spring positioned between the first and second cold plates such that the spring force applies pressure forcing the first and second cold plates towards the module.

Embodiments of the disclosed invention offer fast, easy, drip free removal and replacement of liquid cooled high power electronics equipment.

Other aspects and advantages of the invention, as well as the structure and operation of various embodiments of the invention, will become apparent to those ordinarily skilled in the art upon review of the following description of the invention in conjunction with the accompanying drawings.

BRIEF DESCRIPTION OF THE DRAWINGS

Embodiments of the invention will be described with reference to the accompanying drawings, wherein:

FIG. 4b illustrates a side view of the mechanism of FIG. 4a;

FIG. 5b illustrates a cross sectional view of the mechanism of FIG. 5a;

Similar references are used in different figures to denote similar components.

DETAILED DESCRIPTION OF THE PREFERRED EMBODIMENTS

Figure 1:
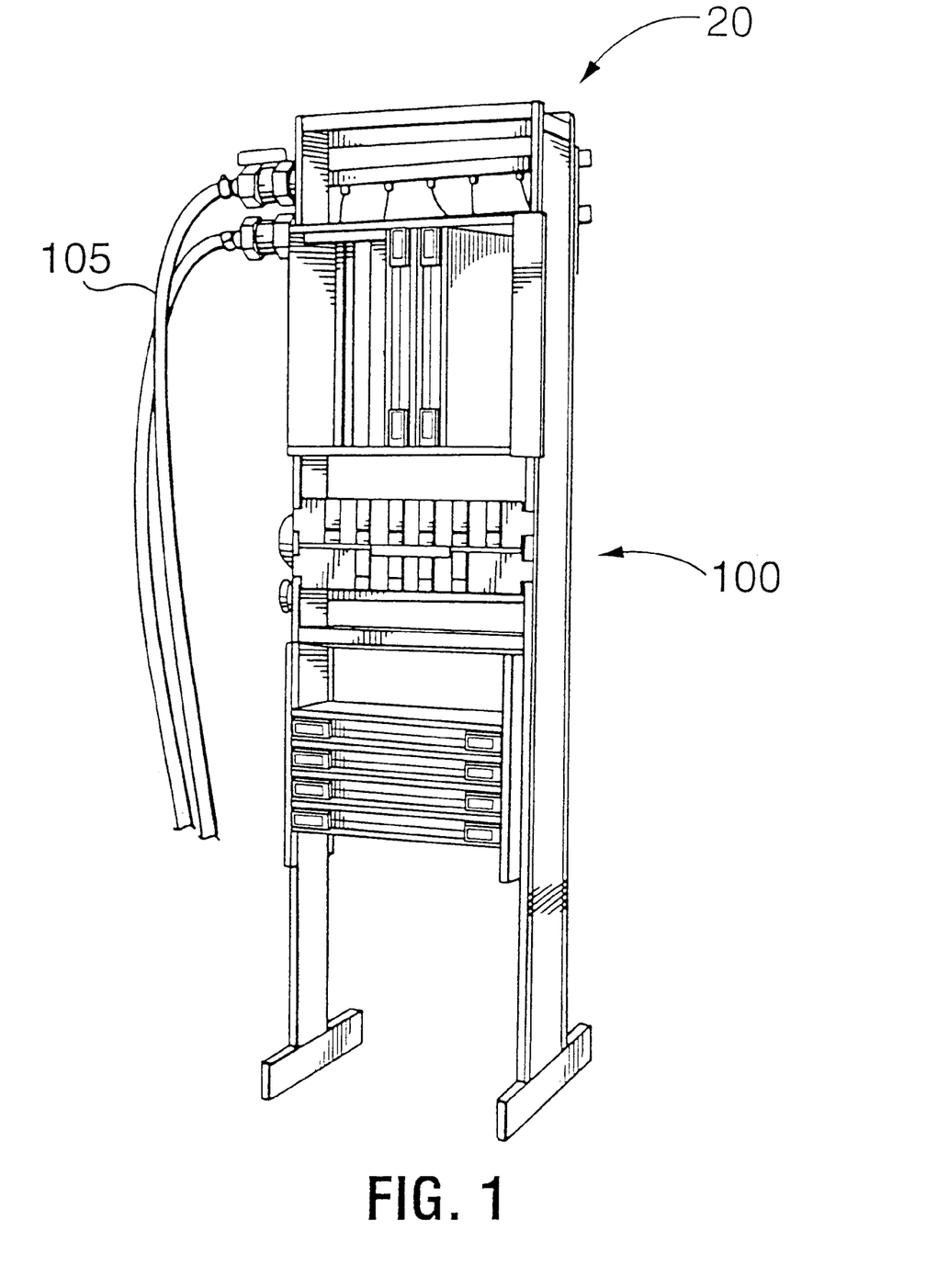
FIG. 1 illustrates a front elevational view of a typical electronic shelf unit including an embodiment of the liquid cooling apparatus of the present invention.

Referring to FIG. 1, the disclosed liquid cooling apparatus 100 is fully compatible with and can be applied in a multiple shelf arrangement 20 (as seen) or a multiframe arrangement in central office (CO) or point of presence (PoP) (not shown) as known in the art. The shelf consists of mechanical structure which accommodates the electronic modules and liquid cooling plates. The arrangement between the electronics and liquid cooling plates depends on the application but may vary from sandwich type (wherein the electronic module is between two cooling plates) or any other pattern. The shelf may be adapted to contain either vertical modules and/or horizontal modules and any required auxiliary equipment. The illustrated shelf 20 and disclosed liquid cooling apparatus 100 is ideally suited to the communications industry, including telecommunications and data communications although it may be used in any suitable environment.

Figure 2A:
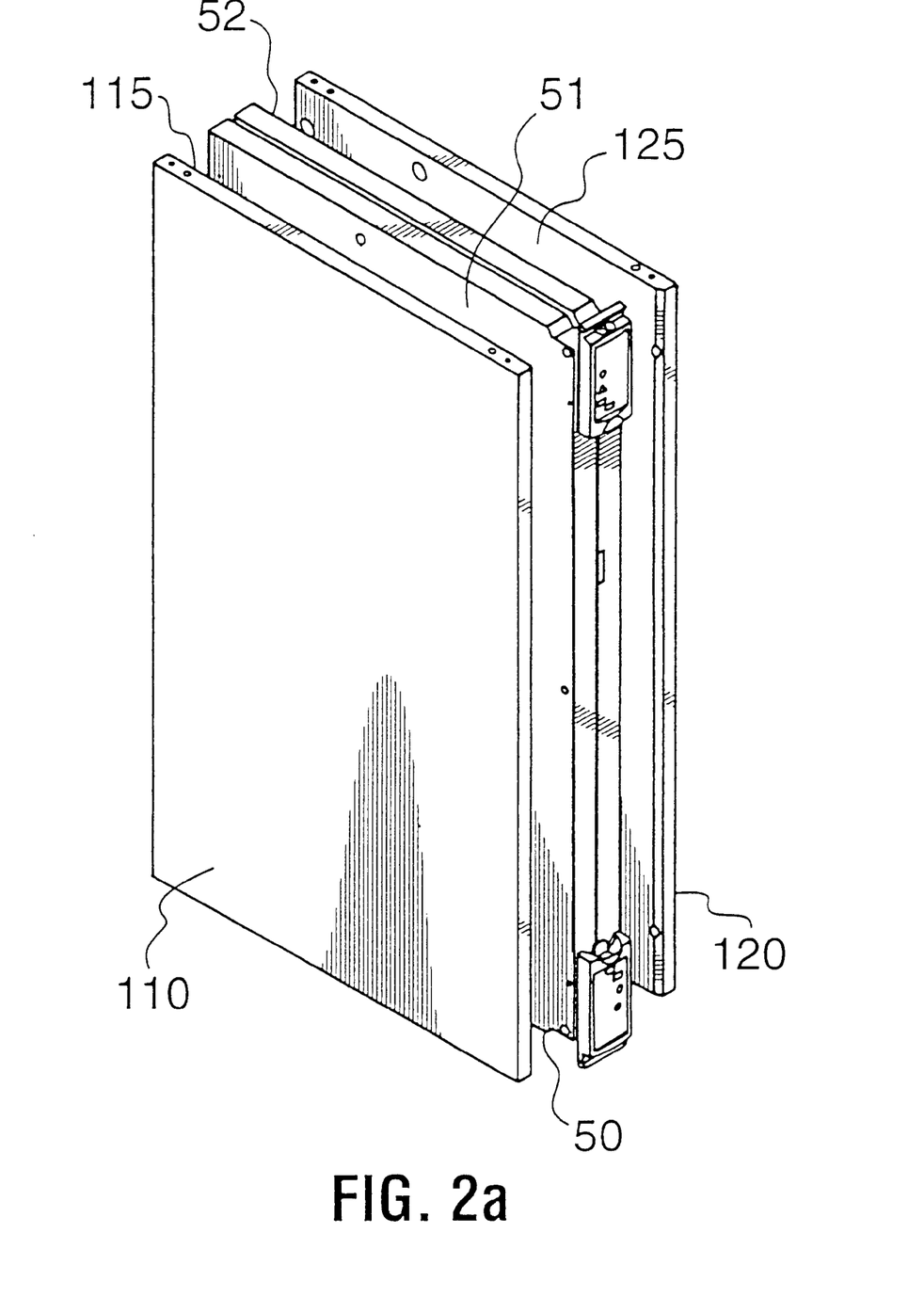
FIG. 2a is an exploded view of a single electronic module excluding a biasing mechanism with an embodiment of the liquid cooling apparatus mounted thereto.
Figure 2B:
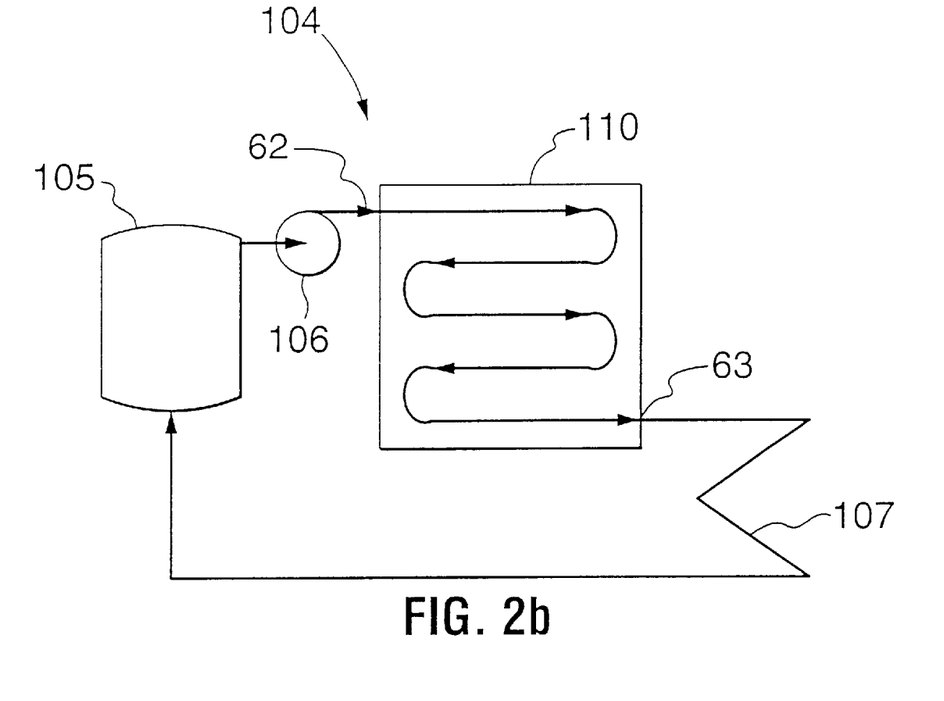
FIG. 2b illustrates a single cooling plate with a secondary loop system.

Referring to FIG. 2a, the cooling apparatus 100 includes first and second metal cold plates 110, 120 with liquid circulating in them as seen in FIG. 2b. A single electronic module 50 is equipped with two plates 110, 120 mated with the module's primary sides, that is the sides 51, 52 of greater surface area. Preferably, the mating cooling plate surfaces 115, 125 cover the entire module primary surface. A biasing mechanism (as is described below and not shown in this figure) allows contact between a cooling plate surface and a mating module surface. The contact pressure achieved by applying these cold plates to two opposite primary faces of an electronic module increases the cooling capacity and negates transverse forces through electrical connectors. Each cold plate has an inlet 62 and an outlet 63 (FIG. 2b) to permit liquid flow through the plate. As the liquid flows through the plate 110, 120, heat is transferred from the module 50 through the mating surfaces 51, 52, 115, 125 and to the liquid thereby cooling the module 50. During operation the liquid in the cold plates 110, 120 exchange the heat with a secondary loop system 104 comprising a liquid to liquid heat exchanger 107 and a watertank with a cold water supply 105 seen in FIG. 2b. The liquid circulation and flow are obtained by a circulating pump 106. Preferably, the cold plates 110, 120, biasing mechanism and the entire liquid cooling loop are permanently part of the shelf 20.

In a preferred embodiment, the entire shelf unit 20 of FIG. 1 is populated with these liquid cooling assemblies 100 and modules 50.

Figure 2C:
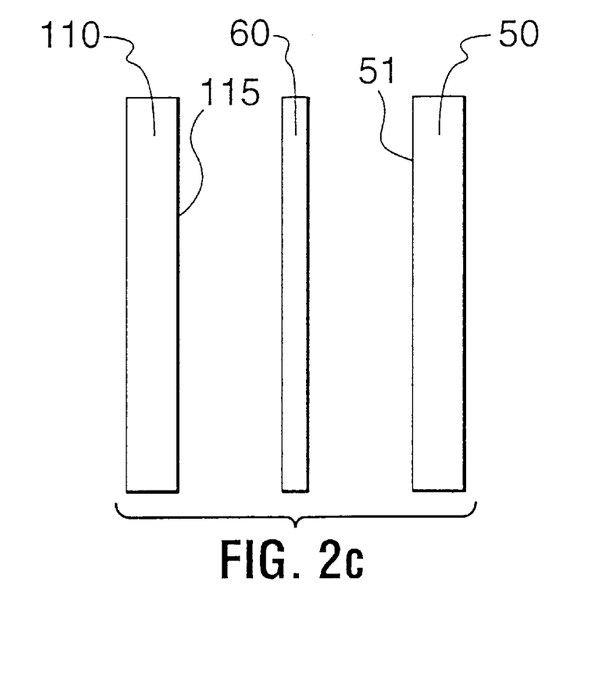
FIG. 2c illustrates the use of thermal interface material.

In one embodiment illustrated in FIG. 2c, between a mating module surface 51, 52 and cold plate surface 115, 125, there is a thermal interface layer 60 which helps eliminate air gaps, between the cold plates and the modules. Aside from low thermal impedance requirement, the thermal interface material should satisfy the requirements for 0.02 inch compliance at low applied pressure, no content of free silicon and to allow 200 cycles of electrical module (in and out) without any distortion of interface material. In a preferred embodiment, the interface material is fluoropolymer composite that consists of an expanded polytetrafluoroethylene matrix that has been filled with boron nitrite particles. Further, each cold plate surface is manufactured as smooth as economically possible to increase the surface area contact between the mating surfaces of the cold plate and the module and to eliminate as many air gaps as possible.

The module 50 preferably remains independent of the liquid cooling apparatus 100 so the module 50 can be inserted and removed individually from the cold plates 110, 120 in the shelf without breaking the liquid plumbing connections, thus avoiding fluid leaks. This is accomplished by a biasing mechanism which tightens the two cold plates towards the electronic module that it is cooling. This tightening, or applied pressure serves to reduce the thermal contact resistance between the plates and the module.

Figure 3:
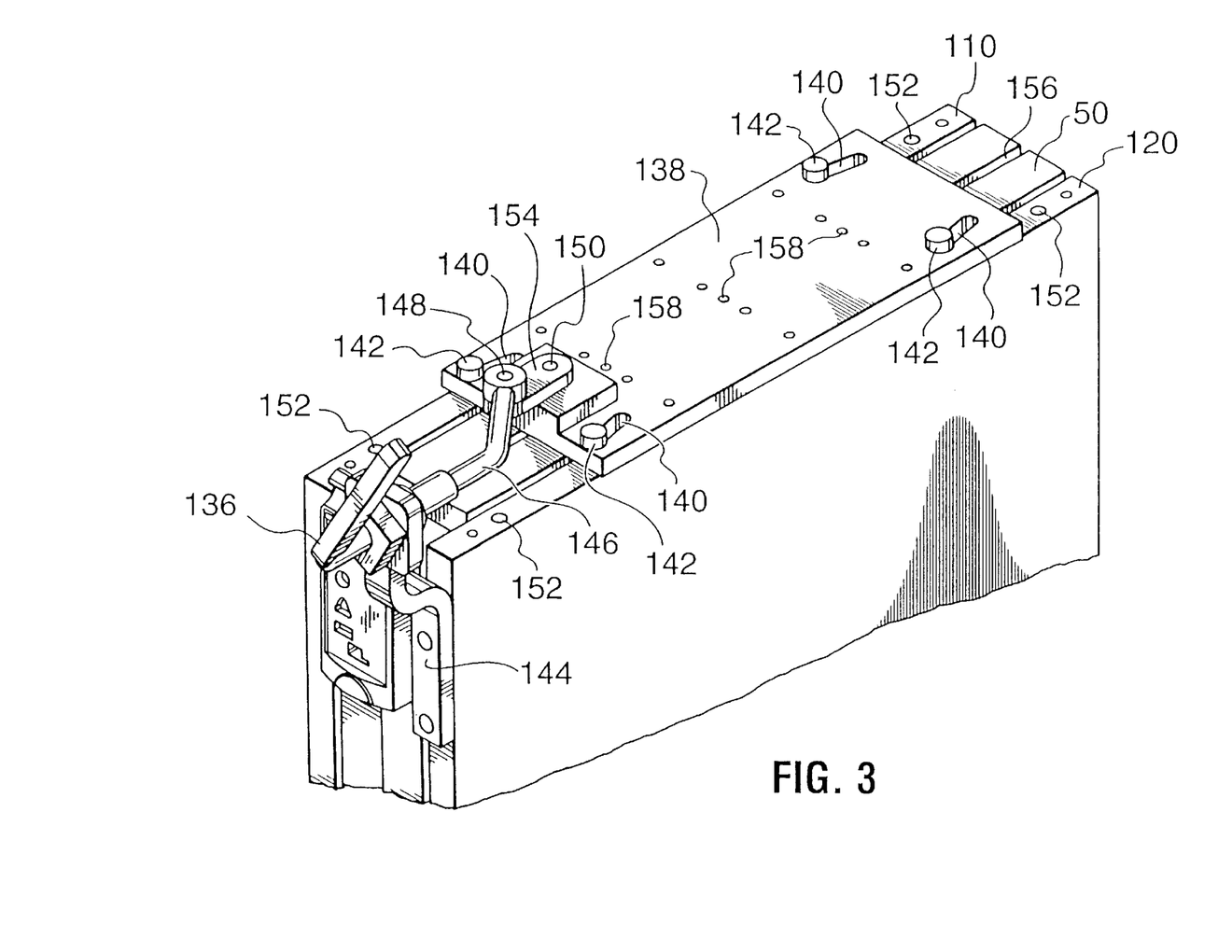
FIG. 3 illustrates a perspective view of a clamping bias mechanism.
Figure 4A:
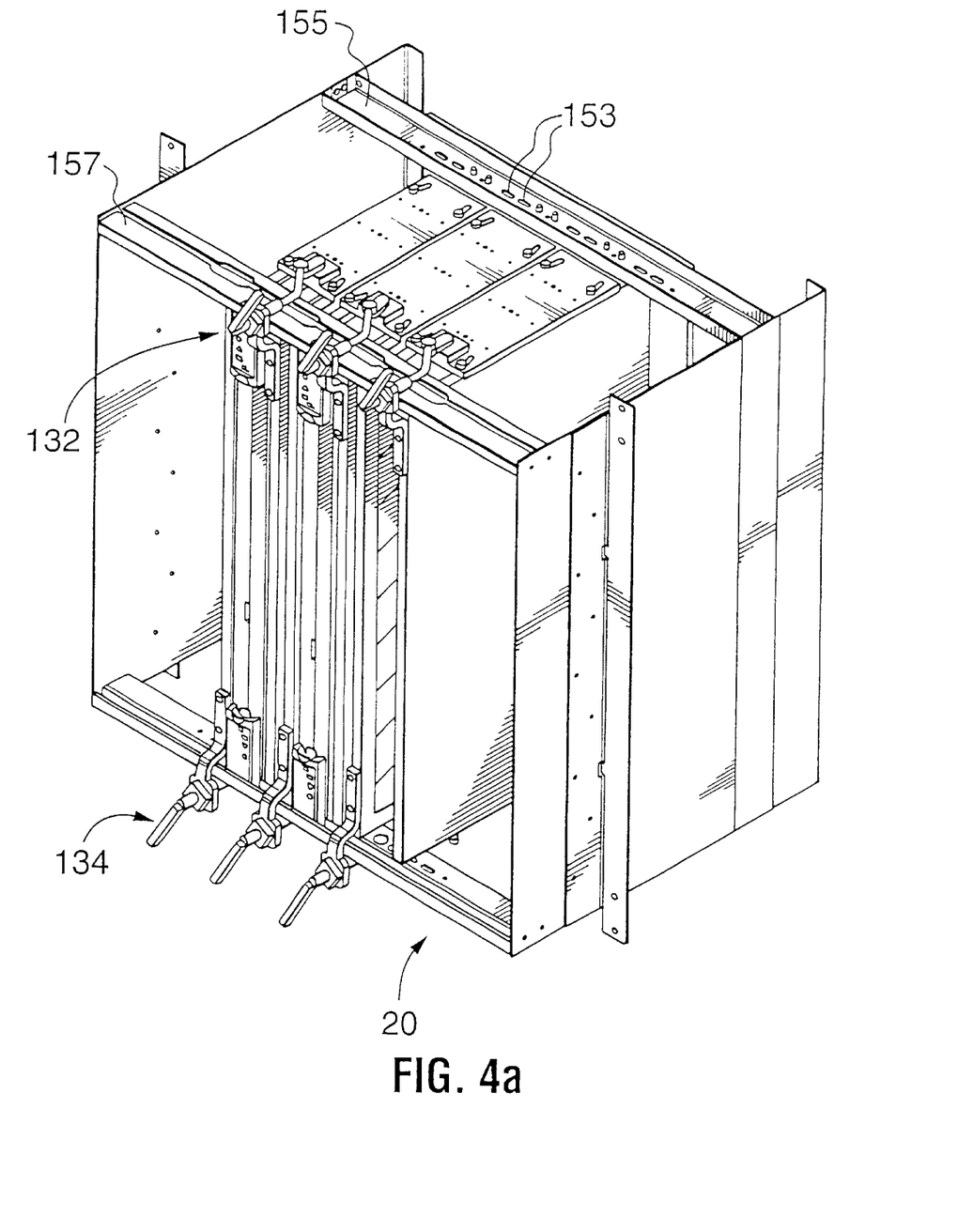
FIG. 4a illustrates a perspective view of a shelf unit comprising a liquid cooling apparatus with a clamping bias mechanism used in one embodiment.
Figure 4B:
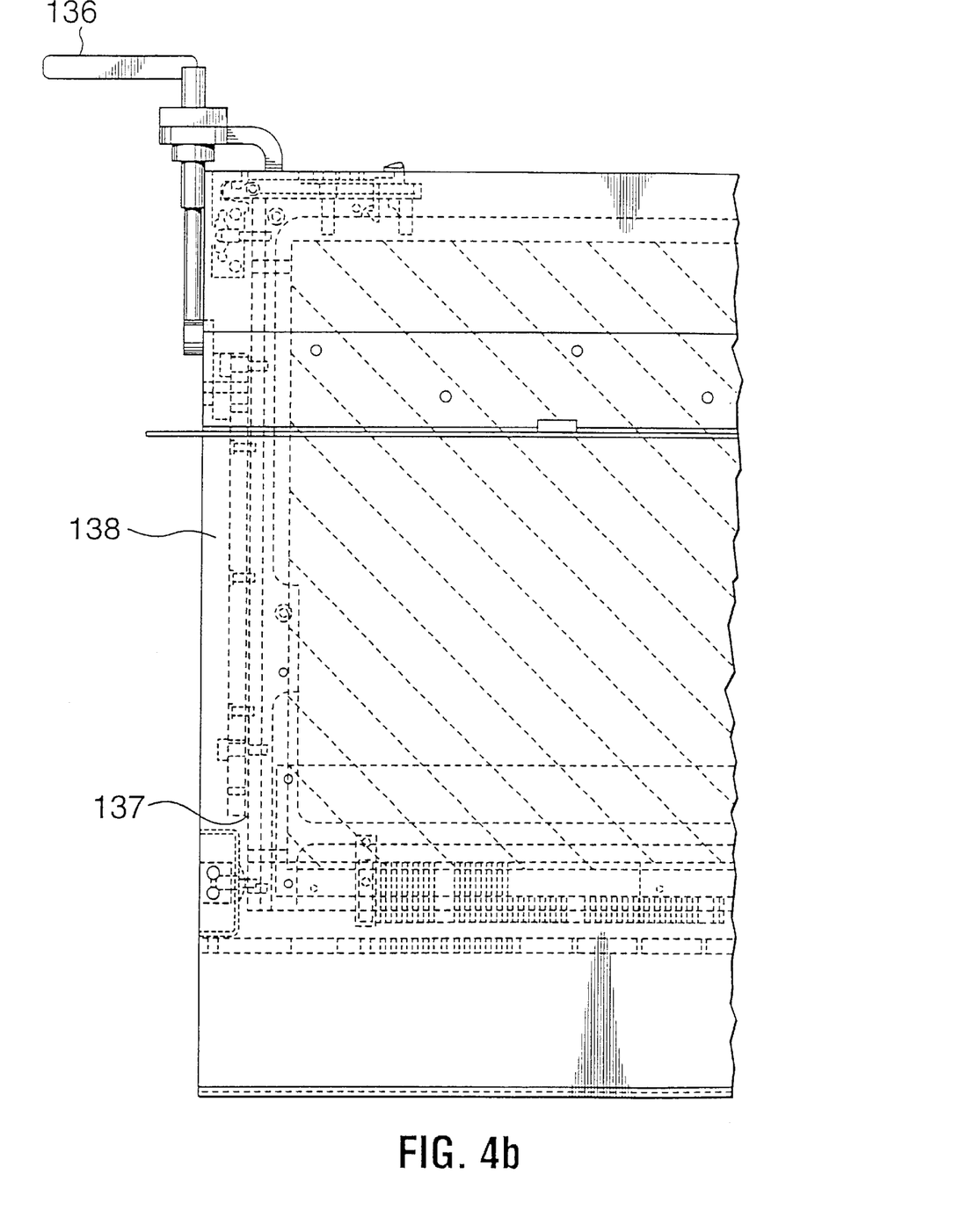

Referring to FIGS. 3, 4a and 4b, there is illustrated a clamping bias mechanism 130. Each pair of cooling plates 110, 120 cooling a particular module 50 has two clamps 132, 134 mounted to opposite ends of the module. This is illustrated in FIG. 4a wherein a shelf unit 20 is shown to have three modules, each with a cooling apparatus. Each apparatus comprises two cooling plates on both primary surfaces of the module and two clamps. For the sake of simplicity, one such clamp is described.

Referring back to FIG. 3, the clamp includes a tool clamp 136 as is common in the art. The rod 146 of the clamp is bent such that it acts on the slide plate 138 at approximately the centre line. The tool clamp 136 is mounted to the cold plate 120 with a bracket 144. The rod 146 is attached to the slide plate 138 via member 154 at pivot points 148 and 150.

The slide plate 138 includes angled slots 140. Pins 142 fixed in each cold plate 110 and 120 pass through slots 140, attaching slide plate 138 to each cold plate 110, 120. The angled slots 140 allow the movement of slide plate 138 to move the cold plates 110 and 120 toward or away from the module with pins 142.

The slide plate 138 is moved toward or away from the tool clamp 136 by actuating the clamp.

Figure 4C:
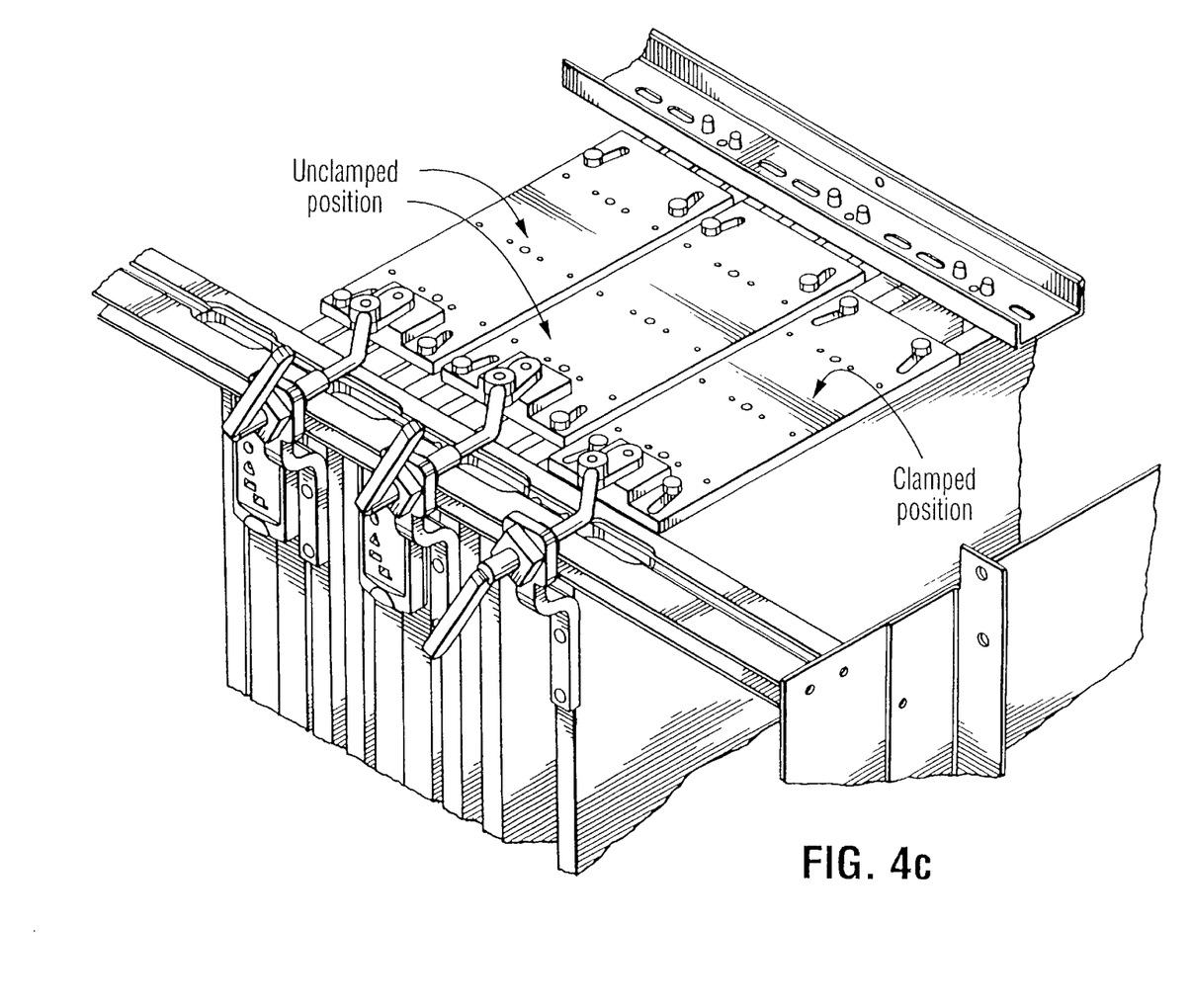
FIG. 4c illustrates the positions of a clamped and unclamped bias mechanism of FIG. 3.

As the tool clamp 136 is actuated and the plates 110, 120 move in, or clamp together, the bracket 144 attached to the cold plate 120 moves in as well. The pins 142 move from a unclamped position in its respective slot to a clamped position (seen in FIG. 4c) such that they move in as well. The member 154 prevents the slide plate 138 from twisting with this movement by pivoting at pivot points 148, 150.

In one embodiment, the module 50 includes a slot 156 in which guide pins 158 fit. This pin 158 in the slot 156 mounts the module 50 to the slide plate 138 when installed and keeps the plate 138 in the centre of the module 50 at all times.

Preferably, the slide plate 138 does not rest on the module 50 and cold plates 110, 120 but hovers slightly above leaving gap 137 as seen in FIG. 4b, and is centered on the module 50. This adds to the module 50 position flexibility and the cold plates 110, 120 clamp around the module 50 in any position within a limited range. Module's 50 final position in shelf 20 is determined by engaging the module 50 with backplate 178 connector.

Slide plate 138 is positioned by cold plates 110, 120 before module 50 is clamped and by guide pins 158 in slot 156 in the module.

Cold plates 110, 120 are located in the shelf 20 by pins (not shown) fixed in positions 152 in the cold plates 110, 120. The pins (not shown) protrude through slots 153 in shelf 20 cross members 155 and 157. Slots 153 permit cold plates 110, 120 to move toward and away from the module 50 but restrict movement of cold plates 110, 120 toward and away from the front of shelf 20.

The arrangement allows for flexibility in placing a module 50 since the slide plate 138 and cold plates 110, 120 will shift in concert so that when the cold plates 110, 120 clamp, the slide plate 138 remains symmetrical to the module 50.

Figure 5A:
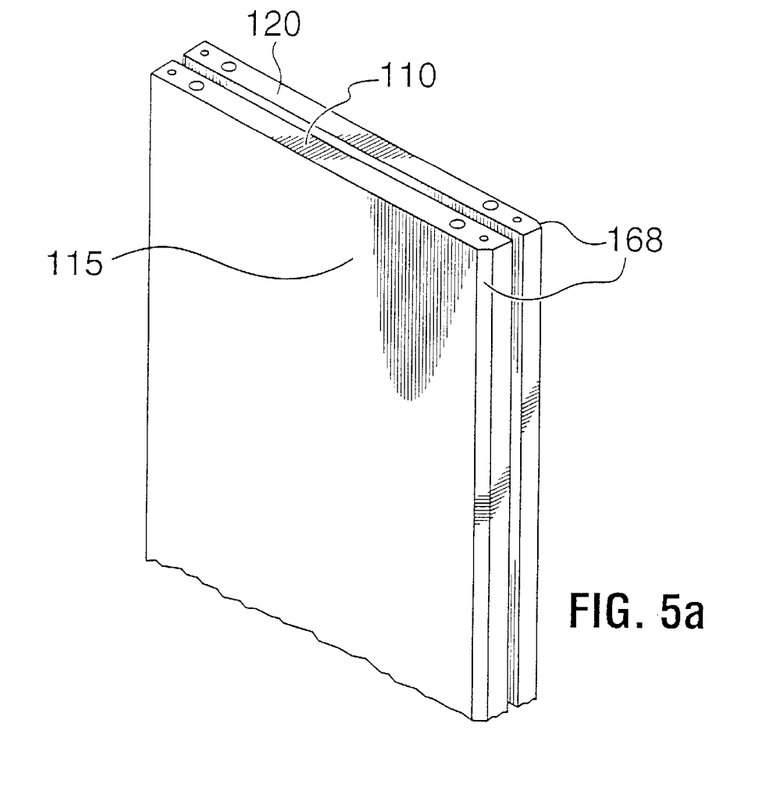
FIG. 5a illustrates an exploded view of a spring bias mechanism.
Figure 5B:
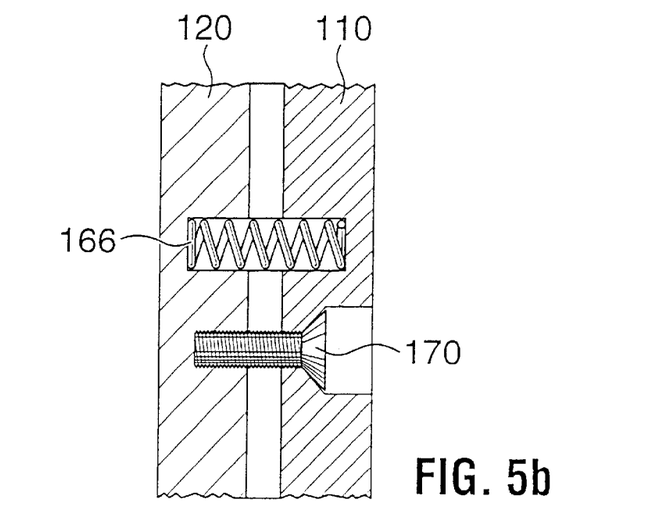
Figure 6:
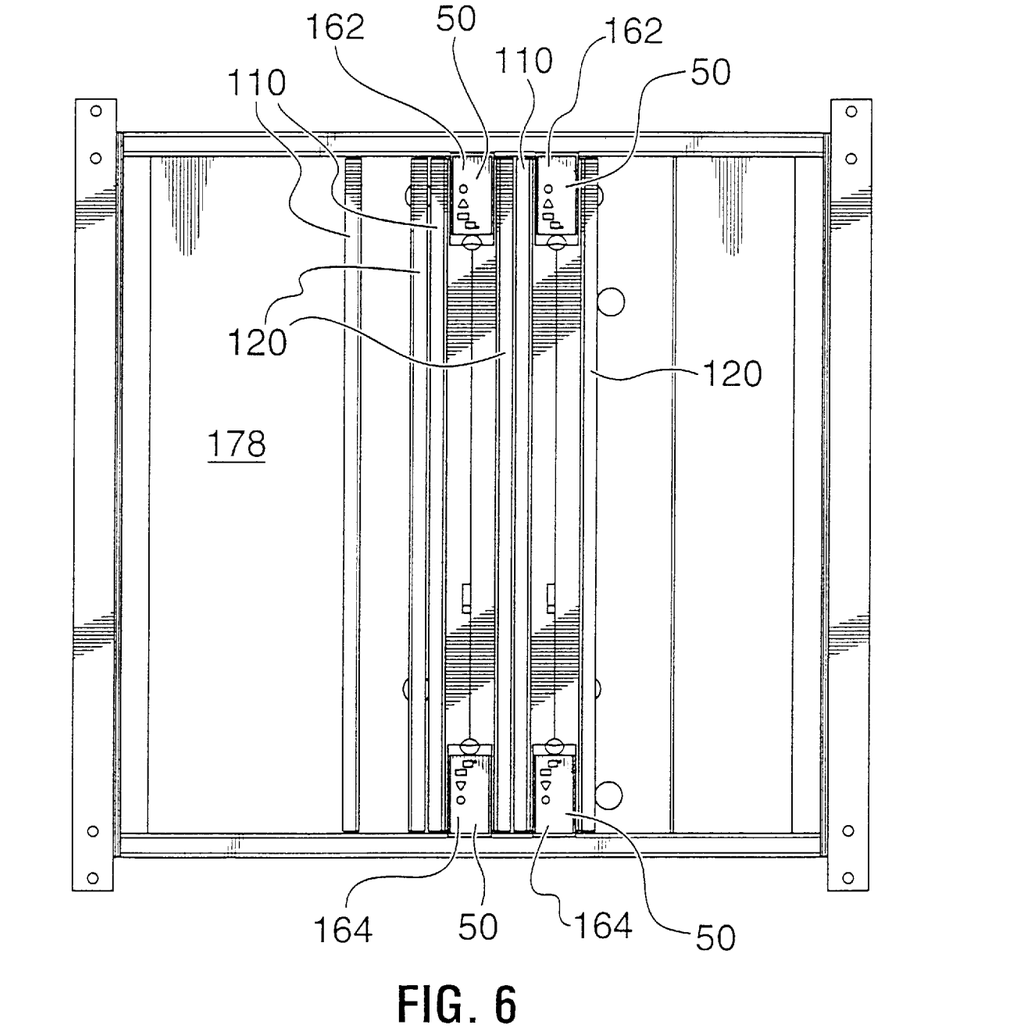
FIG. 6 illustrates a front elevational view of a shelf unit comprising a liquid cooling apparatus with a spring bias mechanism used in one embodiment.

Referring to FIGS. 5 and 6, another type of biasing mechanism is illustrated. As an alternative to the clamp, a spring 166 could be used to hold the cold plates to the module.

Each module 50 has a cold plate 110, 120 on each side. The cold plates 110, 120 are assembled in pairs as seen in FIG. 6. In each pair, the cold plates 110, 120 are separated by spring 166 and travel stops 170 hold the assembly together. In this embodiment, the stops are shown to be screws.

Each cold plate 110, 120 location to shelf is similar to clamp mechanism cold plate mounting.

Module 50 is inserted between two cold plate pairs with the aid of a lead-in 168 on the cold plates 110, 120.

The force of the spring 166 needs to be sufficient to move the cold plates 110, 120 against the walls of the module 50 and the force needs to be low enough to permit insertion of the module 50 between the cold plates 110, 120.

Heat transfer efficiency relies on achieving flat constant surfaces 115, 125 on the cold plates 110, 120 and surfaces 51, 52 on the module 50.

In this embodiment, the travel distance of spring 166, is about 3 mm.

The biasing mechanism is such that the cold plates are opposing each other and collectively form a clamp about the module. Since the mechanism provides this inward pressure, the apparatus is not dependent on any other fulcrum to generate pressure. Further, the mechanism allows limited adjustability within the modules position within the shelf such that the cold plates move with the module as a single unit without reducing the force applied to the module. This allows flexibility in plugging in the module to various locations in the shelf unit. In other words, allowing the module to float relative to the connector enables the backplate 178 connector mating tolerances to be met.

The use of these biasing mechanisms allows for engagement and disengagement of a single or multiple modules from the shelf unit without disturbing the wiring of other components or the liquid cooling plumbing connections.

In a preferred embodiment, the modules and cold plates are stacked parallel to one another, either horizontally or vertically and all the modules are electrically connected to a common plane (backplate 178) in the shelf unit of FIG. 1. In this way, the functionality of the shelf is maximized.

Figure 7:
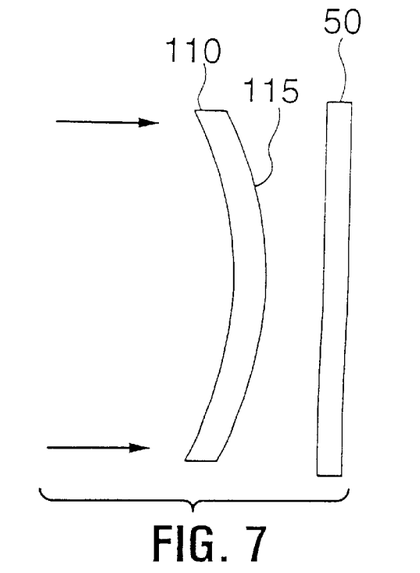
FIG. 7 illustrates another embodiment of the liquid cooling apparatus.

In another embodiment the cold plates are pre-bowed in a convex shape as illustrated in FIG. 7. First the cold plates are pre-bowed and then pressure is applied on the ends by the biasing mechanism such as to flatten out the convex. This results in a more uniform pressure being applied to the module surface as the convex flattens out since the convex shape ensures there is applied force at the centre of the surface.

In a preferred embodiment, the liquid in the cold plates travel along either tubes or channels. As well, it is preferred that the liquid inlet and outlet ports are located on the side of the cold plate so as to not interfere with the electric cabling on the front or back faces.

Figure 8:
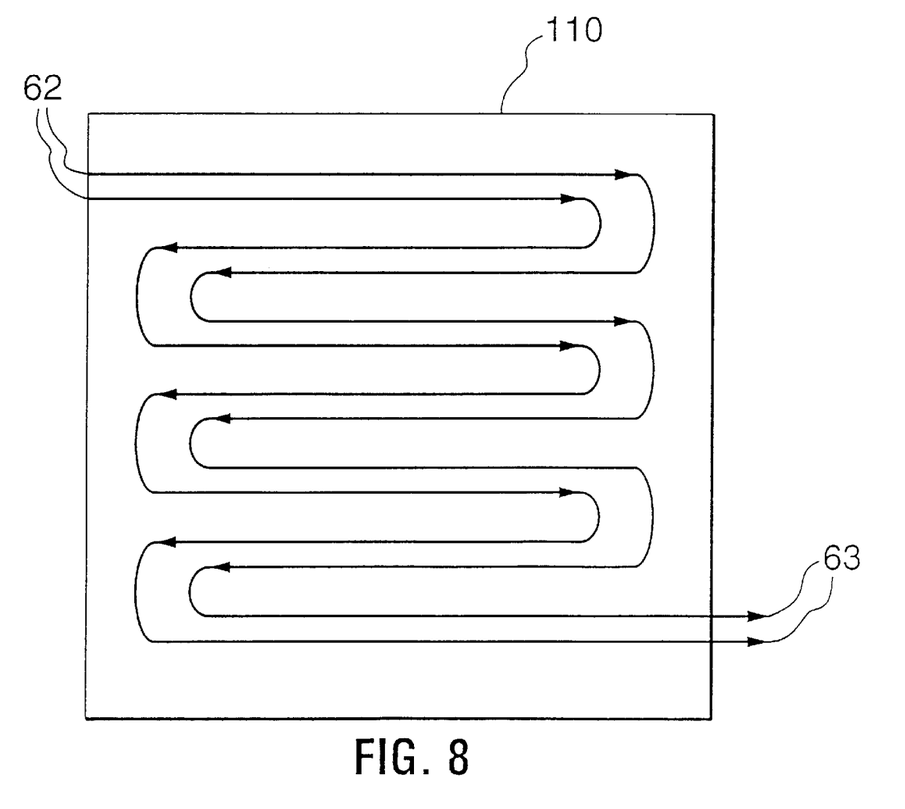
FIG. 8 illustrates yet another embodiment of the liquid cooling apparatus.

In another embodiment illustrated in FIG. 8, each cold plate includes multiple parallel cooling loops. This prevents one loop from getting too warm during operation.

In a preferred embodiment, the liquid used is water, but also could be oil, refrigerant or any other suitable liquid.

In a preferred embodiment, the liquid is maintained at an appropriate temperature prior to entering the cold plates so as to reduce condensation. The liquid can be maintained at a temperature above either the ambient temperature or the dew point temperature. In this cage, the liquid cooling system would also comprise a state-of-the-art control system to accomplish this.

The cold plate liquid flow pattern is preferably designed to manage the areas requiring excessive heat transfer.

By providing the liquid cooling apparatus as an independent apparatus from the modules, the overall system provides for fast, easy and drip free removal and addition of modules to a shelf unit. Using liquid cooling allows for increased heat removal which in turn allows the electronic equipment within the module to have increased functional abilities. In addition, by using liquid cooling, the floor space and real estate required for electrical cabling lengths and diameters, power distribution losses and associated power conversion and battery back up costs are all reduced thereby reducing the CO infrastructure costs.

The use of a liquid cooling apparatus as opposed to air cooling, allows for more efficient cooling, thus allowing better functionality in each unit and lower costs. This will allow the high capacity electronics equipment being demanded to be provided. The use of liquid cooling also eliminates the many high power fans needed for air cooling and replaces them with a single fluid pump which can be located in a sound proof enclosure thus reducing operational noise. As well, since local vibration through turbulent airflow and air pressure on local device heat sinks are eliminated, the reliability of the cooling is increased.

The disclosed apparatus is applicable for high capacity switching processing and transport equipment placed in dense point of presence(PoP) environment as well as large power amplifiers for wireless base station applications inside weather protected communication hubs.

Liquid cooling also better allows electronics to be kept at a constant temperature irrespective of room air temperature excursions which improve the function and reliability of some devices.

The disclosed apparatus combines the advantages of high heat transferring capabilities of liquid with isothermal heat removal from the module. The disclosed system enables better thermal performance while allowing for flexible service requirements. The system provides for overall improved functionality for electronic equipment.

While the invention has been described according to what are presently considered to be the most practical and preferred embodiments, it must be understood that the invention is not limited to the disclosed embodiments. Those ordinarily skilled in the art will understand that various modifications and equivalent structures and functions may be made without departing from the spirit and scope of the invention as defined in the claims. Therefore, the invention as defined in the claims must be accorded the broadest possible interpretation so as to encompass all such modifications and equivalent structures and functions.

What is claimed is:

1. An apparatus for cooling of an electronic module in a shelf unit comprising:
   at least first and second cold plates, each cold plate comprising an inlet and an outlet for coolant flow, said first and second cold plates adapted to receive the module therebetween; and
   a mechanism for moving the first and second cold plates towards and away from the module into operating and released positions respectively relative to the module when positioned therebetween such that:
      (a) when the cold plates have moved toward the module into the operating position, a surface of each said cold plate comes into heat transferring relationship with an associated surface of the module so that, in use, as a coolant flows through each cold plate, heat is transferred from the module to the coolant in each cold plate, and
      (b) when the first and second cold plates have been moved away from the module into the released position, the module is spaced from the cold plates to enable the module to be readily removed from between the cold plates.

2. An apparatus as claimed in claim 1 wherein the mechanism comprises a clamping mechanism associated with each cold plate both to move said cold plates toward the module and to urge the cold plates into said heat transferring relationship with the module.

3. An apparatus as claimed in claim 2 wherein the clamping mechanism comprises:
   a tool clamp mounted to one of said cold plates; and
   a slide plate positioned for movement along the first and second cold plates, the slide plate being operatively connected to the first and second cold plates such that movement of said slide plate effects the movement of said plates toward and away from the module, the tool clamp being attached to the slide plate such that actuation of the tool clamp causes said movement of the slide plate.

4. An apparatus as claimed in claim 1, wherein the apparatus further comprises an interfacing material adapted to be located between said surfaces of each cold plate and the module when in use for enhancing the heat transferring relation between the cold plates and the module.

5. An apparatus as claimed in claim 4 wherein the interfacing material is fluoropolymer composite.

6. An apparatus as claimed in claim 1, wherein said surfaces of each cold plate are of a substantially bowed or convex shape and are sufficiently flexible so that, when the cold plates are urged towards the module, the convexly shaped cold plate surfaces flatten out so as to enhance said heat transferring relationship.

7. An electronic shelf unit for mounting a plurality of electronic modules, the shelf unit having mounting means for removably electrically connecting an electronic module, and comprising an associated cooling apparatus for cooling of the electronic module, the cooling apparatus comprising:
   at least first and second cold plates, each cold plate comprising an inlet and an outlet for coolant flow, said first and second cold plates adapted to receive the module therebetween; and
   a mechanism for moving the first and second cold plates towards and away from the module into operating and released positions respectively relative to the module when positioned therebetween such that:
      (a) when the cold plates have moved toward the module into the operating position, a surface of each said cold plate comes into heat transferring relationship with an associated surface of the module so that, in use, as a coolant flows through each cold plate, heat is transferred from the module to the coolant in each cold plate, and
      (b) when the first and second cold plates have been moved away from the module into the released position, the module is spaced from the cold plates to enable the module to be readily removed from between the cold plates.

8. An electronic shelf unit as claimed in claim 7 wherein the shelf unit is adapted to hold multiple electronic modules, there being multiple pairs of said cold plates, the plates of each pair adapted to be arranged on opposite sides of the respective modules in said heat transferring relation.

9. An apparatus as claimed in claim 1, further comprising a heat exchanger for allowing heat transfer between fresh coolant and coolant in the plates.

10. An electronic shelf unit for mounting a plurality of electronic modules, the shelf unit having mounting means for removably electrically connecting an electronic module, and comprising an associated cooling apparatus for cooling of the electronic module, the cooling apparatus comprising:

at least first and second cold plates, each cold plate comprising an inlet and an outlet for coolant flow, said first and second cold plates adapted to be positioned on opposing sides of the module, a surface of each said cold plate being in close heat transferring relation to an associated surface of the module; and a biasing mechanism to provide pressure capable of forcing the first and second cold plates towards the module to provide said close heat transferring relation between the plates and the module whereby as a cooling coolant flows from the inlet of each cold plate to the outlet of each cold plate, heat is transferred from the module to the coolant in each cold plate when in use, the biasing mechanism including:

(a) a tool clamp mounted to one of said cold plates; and
   (b) a slide plate positioned along the first and second cold plates, the slide plate being pinned to the first and second cold plates through angled slots, the tool clamp being pivotally attached to the slide plate such that actuation of the tool clamp causes the slide plate to move towards the tool clamp thereby applying pressure forcing the first and second cold plates towards a module positioned therebetween.

11. An apparatus as claimed in claim 3, wherein said slide plate is operatively connected to said cold plates via pins on said plates which extend through slots in said slide plate, the slots being angled so as to effect said movement of said cold plates in response to the movement of the slide plate.

12. An apparatus as claimed in claim 1, wherein the mechanism includes a biasing mechanism, which comprises:

(a) a spring member disposed between the cold plates such that the first and second cold plates are biased towards the module in the operating position so as to enhance said heat transferring relationship; and (b) a stop means for remaining the first and second cold plates spaced-apart against the biasing force when the module is removed, thereby enabling the module to be readily inserted in between the cold plates.

13. An electronic shelf unit as claimed in claim 7, wherein the cooling apparatus is flexibly mounted in the shelf relative to the mounting means for the electronic module.

14. An electronic shelf unit as claimed in claim 7, wherein the mechanism provides biasing force to ends of the cold plates, and the plates are pre-bowed, whereby in the operating position the cold plates flatten to engage opposing surfaces of the electronic module.

* * * * *